(12) United States Patent
Gabara

(10) Patent No.: US 6,175,285 B1
(45) Date of Patent: Jan. 16, 2001

(54) INJECTION TUNED RESONANT CIRCUITS

(75) Inventor: Thaddeus John Gabara, Murray Hill, NJ (US)

(73) Assignee: Lucent Technologies, Inc., Murray Hill, NJ (US)

(*) Notice: Under 35 U.S.C. 154(b), the term of this patent shall be extended for 0 days.

(21) Appl. No.: 09/134,602

(22) Filed: Aug. 14, 1998

Related U.S. Application Data

(60) Provisional application No. 60/072,602, filed on Jan. 26, 1998.

(51) Int. Cl.[7] .............................. H03B 7/00; H03B 7/02
(52) U.S. Cl. .................. 331/117 R; 331/45; 331/172; 331/167; 331/132; 331/113 R; 455/260
(58) Field of Search .................. 331/55, 172, 117 R, 331/117 FE, 74, 132, 167, 177 V, 45, 113 R; 455/258, 259, 260

(56) References Cited

U.S. PATENT DOCUMENTS

| | | | |
|---|---|---|---|
| 4,918,406 | * 4/1990 | Baumbach et al. | 331/117 R |
| 5,396,195 | 3/1995 | Gabara | 331/113 R |
| 5,920,235 | * 7/1999 | Beards et al. | 331/108 D |

* cited by examiner

*Primary Examiner*—Arnold Kinkead
(74) *Attorney, Agent, or Firm*—William H. Bollman

(57) ABSTRACT

An AC tuning signal is injected into an LC tank circuit oscillator through an impedance (either reactive, inductive, capacitive and/or resistive) to tune the phase and/or frequency of the LC tank circuit oscillator. A negative resistance is included in parallel with the LC tank circuit oscillator to compensate for losses in the LC tank circuit, and a bias signal is provided to power the operation of the LC tank circuit. The AC tuning signal may be injected into the LC tank circuit using capacitors, resistors, FET or bipolar transistors, and/or inductors. Multiple LC tank circuit oscillators may be used to provide stable multiplied or divided frequencies. In this case, the output of one LC tank circuit oscillator may be used to tune another LC tank circuit oscillator. In another embodiment, the nominal frequency of the LC tank circuit oscillator may be adjusted using a varactor or other voltage-controlled element in the LC tank circuit oscillator under the control of, e.g., the output of a separate PLL loop including another LC tank circuit oscillator.

45 Claims, 11 Drawing Sheets

CLOCK AND DATA RECOVERY

CLOCK AND DATA RECOVERY ated signal on line 420 with the phase and frequency
INJECTION TUNED RESONANT CIRCUITS This application claims priority from provisional U.S. application Ser. No. 60/072,602, filed Jan. 26, 1998, entitled "Synchronous Carrier Recovery Circuits and Injection Tuned Resonant Circuits", the specification of which is explicitly incorporated herein by reference.

FIELD OF THE INVENTION

This invention relates generally to the injection of an AC signal into an LC tank circuit to control an oscillating frequency thereof. More particularly, it relates to the injection of a single-ended or balanced (differential) oscillating signal into an LC tank circuit to tune the oscillating frequency of the LC tank circuit.

BACKGROUND OF THE INVENTION

Oscillators are common devices used in a wide variety of devices, including radio equipment and modems. Oftentimes, the oscillator must be extremely stable and accurate, but as frequencies of devices increase and as the integration of components in integrated circuits increases, oscillator design and operation become extremely challenging.

For many systems, an oscillator exhibiting an oscillation frequency within a small range of a particular value is required. Pre-screening of oscillator devices and/or of the components in the oscillator device permits selection of an oscillator having as accurate a frequency as is required for the particular application. However, pre-screening is expensive and results in low yields.

Crystal oscillators, while having a high quality factor (Q factor), are not conventionally formed on an integrated circuit. On the other hand, inductor/capacitor (LC) tank circuits, another form of oscillator, have been used to provide an oscillator on an integrated circuit, albeit with a lower Q factor.

One way to improve the precision of the oscillation is to use closed-loop techniques for synchronizing an oscillator frequency and/or phase, either to an input signal such as a data stream or to a predetermined reference oscillator. Perhaps the most prevalent closed-loop technique for synchronizing an oscillator to another signal is with the use of a phase-locked loop (PLL), e.g., as shown in FIG. 1.

In particular, FIG. 1 shows the use of a PLL 400 to sense a frequency and phase of a carrier in an incoming modulated signal. The PLL 400 provides a phase and frequency corrected recovered carrier signal to the phase/frequency detector 102 for comparison with the actually received modulated signal (which due to real world conditions contains noise in the form of phase and frequency variations).

In FIG. 1, a phase/frequency detector 102 receives both the incoming modulated signal on line 420 and the output of the PLL 400 at point 422. The phase/frequency detector 102 compares the phase and frequency of the received modulated signal on line 420 with the phase and frequency generated by the PLL 400 to detect the actual phase and frequency of the carrier frequency as it is received in the receiver. This accurately determined carrier frequency is subtracted from the received modulated signal to result in an output of the recovered information signal.

In more detail, the received modulated signal is input to the PLL 400 at line 420. A band pass filter 408 band pass filters the input modulated signal such that sideband information beyond that desired is eliminated. A phase detector 406, charge pump 404 and loop filter 402 provide a comparative phase for the received modulated signal and the locally sensed carrier frequency, and generate a DC signal for control of a voltage controlled oscillator (VCO) 430. The VCO 430 outputs a particular frequency based on the voltage level of its control input.

While having certain advantages, the requirement of a PLL adds cost and complexity to a circuit, which is of particular concern in lower end applications such as low end cordless telephones or other wireless applications. Moreover, the closed-loop nature of the PLL slows the acquisition time necessary to acquire phase lock with changes in the input signal, and thus may limit the maximum frequency, modulation and overall performance of the receiver in certain applications.

There is thus a need to provide an open-loop oscillator circuit which is capable of being formed in an integrated circuit and which is capable of highly precise and accurate operation.

SUMMARY OF THE INVENTION

In accordance with the principles of the present invention, a tunable oscillator comprises an LC tank circuit comprising an inductor and a capacitor. An impedance is in communication with the LC tank circuit, the impedance being adapted and arranged to allow injection of an AC signal corresponding to a desired oscillation frequency of the LC tank circuit.

In accordance with another aspect of the present invention, a tunable oscillator comprises an LC tank circuit comprising an inductor and a capacitor. A plurality of impedances are in communication with the LC tank circuit, each of the plurality of impedances being adapted and arranged to allow injection of a respective phase of an AC signal corresponding to a desired oscillation frequency of the LC tank circuit.

In accordance with yet another aspect of the present invention, a tunable quadrature oscillator comprises a quadrature LC tank circuit comprising an inductance and a capacitance. The quadrature LC tank circuit has at least four nodes. The tunable quadrature oscillator further includes at least four impedances corresponding to the at least four nodes of the quadrature LC tank circuit, each of the plurality of impedances being adapted and arranged to allow injection of a respective phase of an AC signal corresponding to a desired oscillation frequency of the LC tank circuit.

A method of tuning an oscillator in accordance with the principles of the present invention comprises injecting an AC signal corresponding to a desired oscillation frequency into an oscillator circuit, whereby the oscillator circuit is tuned to the desired oscillation frequency.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

Figure 1:
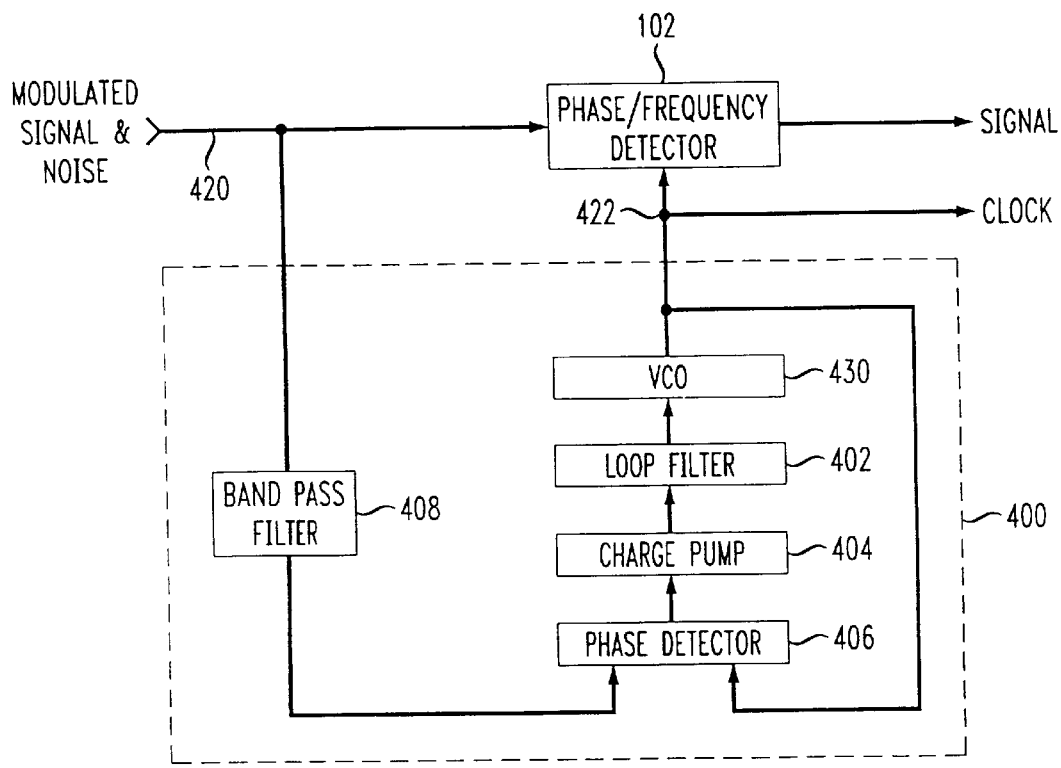
FIG. 1 shows the conventional use of a phase locked loop to sense a frequency and phase of a carrier in a modulated signal.

The present invention provides an injection locked oscillator which is capable of extremely high speed operation and which can be formed on an integrated circuit.

The disclosed embodiments include an LC tank circuit oscillator which, together with the use of an injection locking signal, provides the ability to extract a clock signal from a very high speed data stream, e.g., 2.5 gigabits per second (Gb/s) or higher. Moreover, the injection tuned LC tank circuit oscillator in accordance with the principles of the present invention is capable of being formed on one or more integrated circuits, although it may also include discrete components.

In accordance with the principles of the present invention, an AC injection locking signal is injected into the LC tank circuit oscillator through an impedance (either reactive, inductive, capacitive and/or resistive) to tune the phase and/or frequency of the LC tank circuit oscillator. The AC injection locking signal may be injected either single-ended into only one node of the LC tank circuit with the other node(s) being appropriately grounded or otherwise terminated, differentially into two nodes of the LC tank circuit, or with more than two injection signals. When the AC injection locking signal is injected with more than one path to the LC tank circuit, the injected signals are phase shifted from one another.

As background, the present invention is a result of the inventor's appreciation that an oscillator may be frequency locked with another oscillator under certain conditions. To this end, a test integrated circuit was fabricated in 0.5 micron CMOS technology. The test circuit consisted of a gated ring oscillator having a tap point driving a very large capacitance into the substrate of an integrated circuit. A second data path having an externally applied clock signal was used to drive a second large capacitance into the substrate. The ring oscillator was enabled and a frequency around 10 megahertz (MHz) was observed at the output node of an output buffer driving a low logic level formed in the integrated circuit.

When the external clock signal had a frequency significantly less than 10 MHz, separate frequency peaks of both the external clock signal and the 10 MHz frequency of the ring oscillator were observed on a spectrum analyzer, indicating that the oscillation of the ring oscillator had not locked to the frequency of the externally applied clock signal. However, as the frequency of the external clock signal was increased toward the natural frequency of the ring oscillator, the two frequency peaks observed on the spectrum analyzer became joined at the frequency of the external clock signal, indicating that the ring oscillator had become tuned to the frequency of the external clock signal injected into the substrate. Moreover, the ring oscillator was observed to remain locked to the frequency of the external clock signal even with slight variations in the frequency of the external clock signal from the natural frequency of the ring oscillator, e.g., for variations of about a few percent around the natural frequency of the ring oscillator.

A second test structure was formed using 0.35 $\mu$m CMOS technology. A data path was connected capacitively to an on-chip ring oscillator, this time not through the substrate but through metal I/metal II capacitance. The ring oscillator was observed to lock or tune to the frequency of a separate clock signal applied to the data path in this test as well.

The test ring oscillator did not initially lock to an intermittent clock signal, e.g., an injection clock signal carrying pseudo-random data. However, through simulations, the use of a band pass filter to isolate a particular frequency range in the data signal allowed the test ring oscillator to lock onto the injected clock signal carrying pseudo-random data.

Although these test and simulation results were encouraging, a common disadvantage to ring oscillators is their limited ability to generate high frequency signals. For instance, in 0.35 $\mu$m CMOS technology, clock and data recovery is very difficult at very high frequencies, e.g., at 1.25 Gb/s, mostly due to the minimum gate delay inherent in an inverter stage and the need to connect several inverters in series to form the ring oscillator. Thus, to achieve higher bit rates, it was recognized by the present inventor that it would be necessary to form an oscillator capable of running at comparably higher frequencies with controlled phase characteristics.

The embodiments of the present invention utilize an inductor-capacitor (LC) tank circuit, which not only can be formed in integrated circuit form but is also capable of extremely high oscillation. However, particularly because of the low quality factor of an inductor formed in silicon, a positive feedback circuit may be required to sustain the oscillation of an LC tank circuit.

Suitable LC tank circuit oscillators are shown and described in U.S. Pat. No. 5,396,195 entitled "low-power low dissipation CMOS oscillator circuits", by the same inventor as herein, the contents of which are expressly incorporated herein by reference.

An LC tank circuit oscillator is advantageous to carry out the principles of the present invention, e.g., because energy can be injected effectively into one or more nodes of the LC tank circuit oscillator. In accordance with the principles of the present invention, an LC tank circuit is phase and/or frequency locked to an AC signal injected into one or more nodes of the LC tank circuit.

Figure 2:
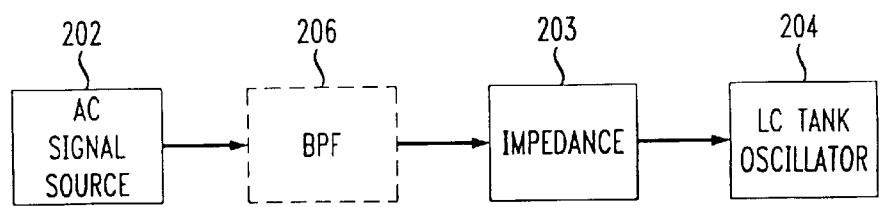
FIG. 2 is a general block diagram showing the injection of an AC signal source into an LC tank circuit oscillator via an impedance.

FIG. 2 is a general block diagram showing the main elements of the present embodiment. In particular, FIG. 2 shows the injection of an AC signal source 202 into an LC tank circuit oscillator 204 via an impedance 203 and optional band pass filter 206.

The AC signal source 202 may be any suitable clock signal, preferably but not necessarily sine wave in nature, but which is within a tunable range of the LC tank circuit oscillator 204. If the AC signal source 202 provides a clock signal which is intermittent, e.g., as with pseudo-random data, the band pass filter 206 may be interjected between the AC signal source 202 and the impedance 203 to isolate the tuning frequency of interest.

The impedance 203 may be capacitive, inductive, or resistive, so long as it does not otherwise interfere with the performance of the LC tank circuit oscillator 204.

Figure 3:
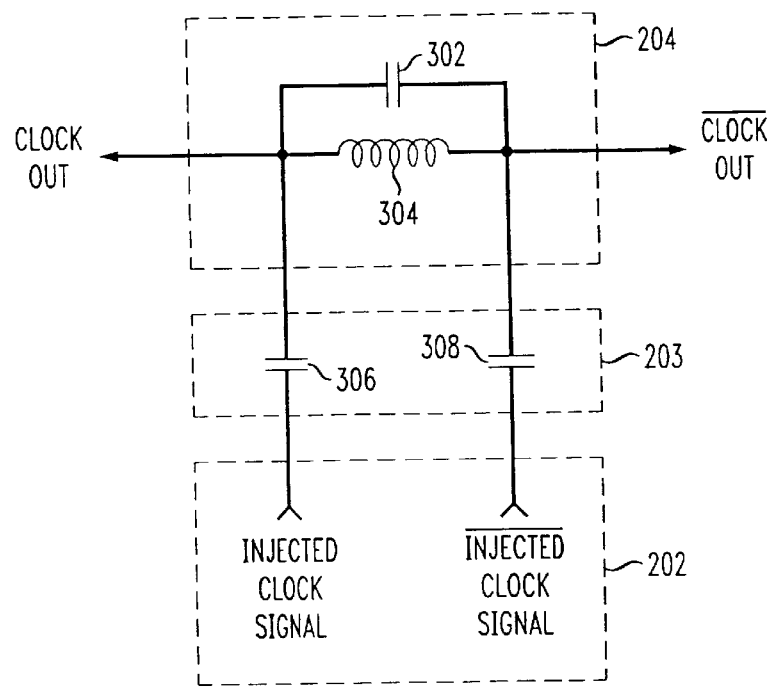
FIG. 3 shows an ideal LC tank circuit including an AC signal injected through an impedance into the LC tank circuit.

The LC tank circuit oscillator 204 may be, e.g., as described in U.S. Patent No. 5,396,195, and/or as shown in more detail in FIG. 3 herein.

In particular, FIG. 3 shows an ideal LC tank circuit including a capacitor 302 in parallel with an inductor 304. FIG. 3 also shows a capacitive impedance 203 including capacitors 306 and 308. However, the LC tank circuit in reality has loss because of, e.g., impedance in the wiring, and thus requires the addition of negative resistance to operate effectively.

Figure 4:
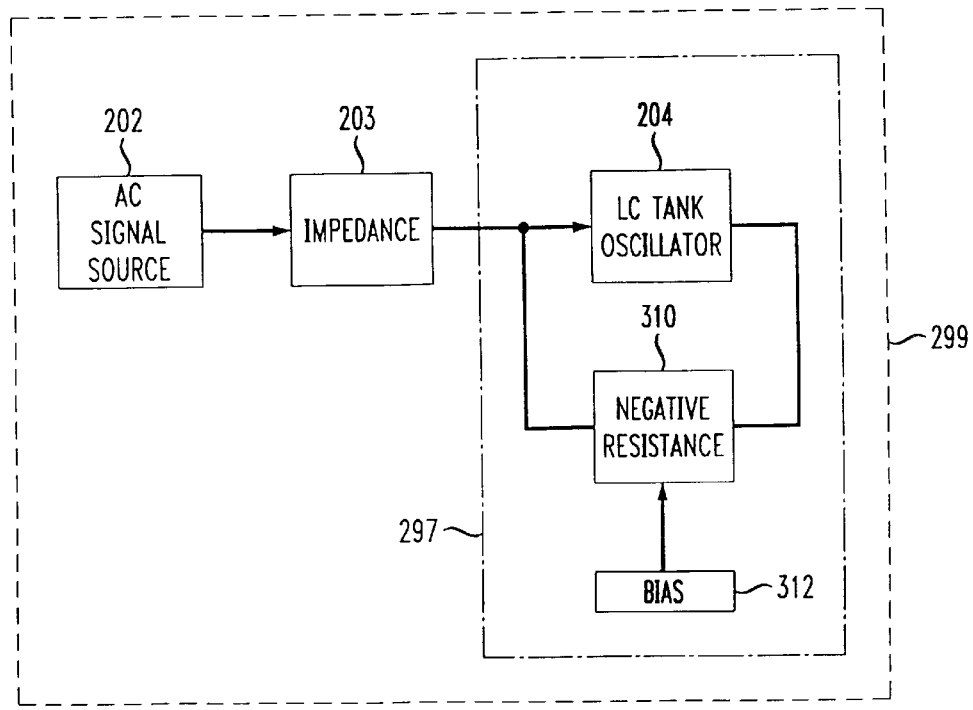
FIG. 4 shows the inclusion of negative resistance and bias in a real-world LC tank circuit oscillator to provide power to the LC tank circuit oscillator.

FIG. 4 shows the inclusion of negative resistance 310 in parallel with the LC tank circuit oscillator 204 to provide power for the perpetual operation of the LC tank circuit oscillator 204. A bias signal 312 is provided to the LC tank circuit oscillator 204 to provide power to the LC tank circuit oscillator for operation.

Figure 5:
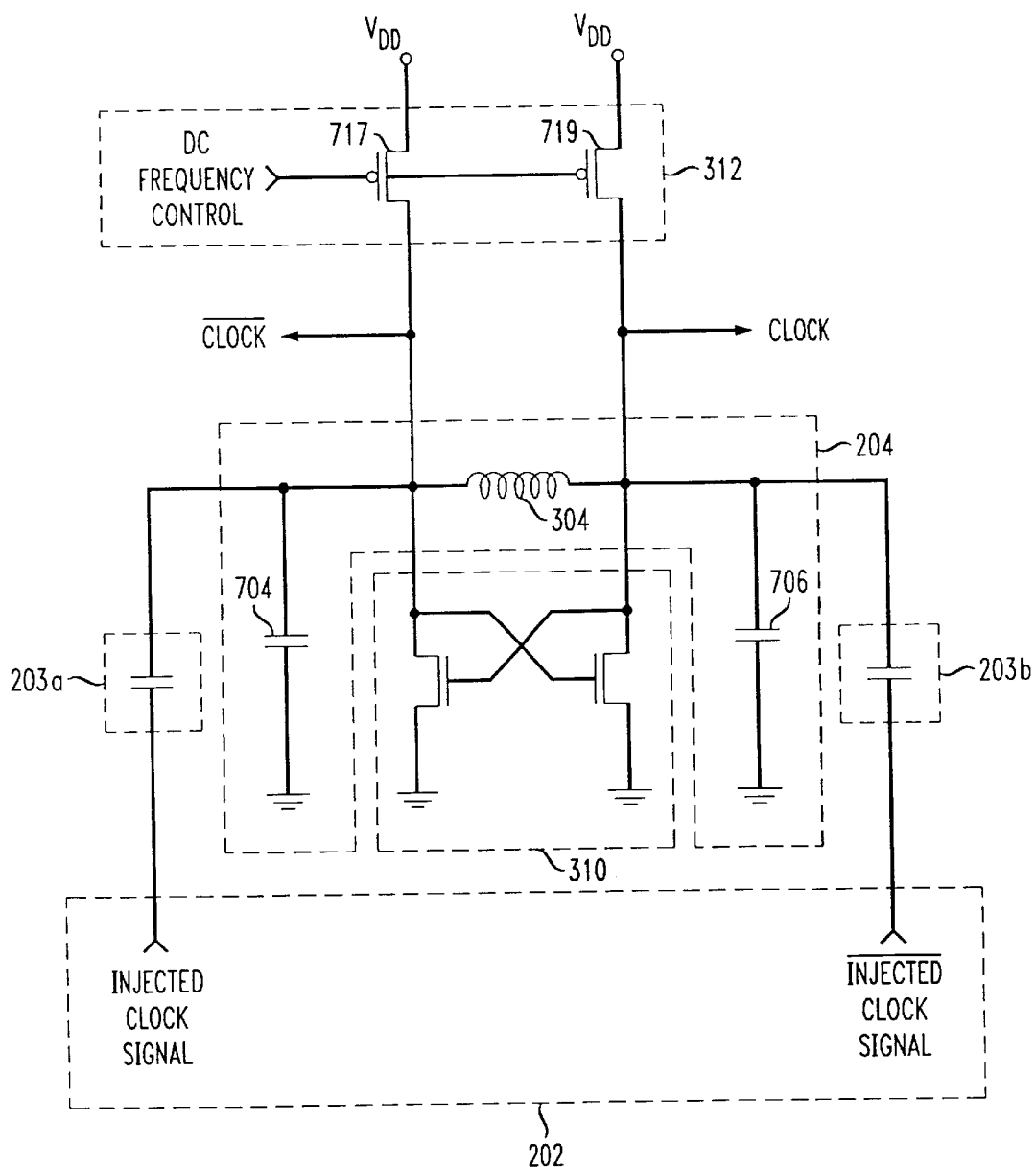
FIG. 5 is a more detailed diagram of the circuit shown in FIG. 4.

FIG. 5 shows a detailed circuit diagram of the embodiment shown in FIG. 4.

In FIG. 5, the LC tank circuit 204 is formed by an inductor 304 in series with capacitors 704 and 706 both connected to ground, which is an equivalent circuit of an inductance in parallel with a capacitance. Another possible LC tank circuit configuration is a capacitor in series with two inductors each tied to ground. The capacitance of the LC tank circuit should include the parasitic capacitance of the included elements, e.g., capacitances in the negative resistance circuit 310. Similarly, the inductance of the LC tank circuit should include the inductance of any wiring or other elements.

The bias 312 may be provided by two p-channel metal oxide semiconductor field effect transistors (MOSFETs) 717, 719, e.g., as shown in FIG. 5. The bias provides the LC tank circuit oscillator 204 with power for operation.

To speed up operation of the LC tank circuit oscillator and/or to assist the LC tank circuit oscillator in achieving stable oscillation, a DC start-up signal may be provided as shown in FIG. 1 of U.S. Pat. No. 5,396,195.

The negative resistance 310 can be, e.g., a cross-coupled MOS structure as shown in FIG. 5. The cross-coupled MOS structure provides a negative resistance which is used in conjunction with the LC tank circuit to sustain oscillation. Alternatively, the negative resistance could be provided by cross-coupled MOS devices as in a conventional random access memory (RAM) structure.

Figure 6:
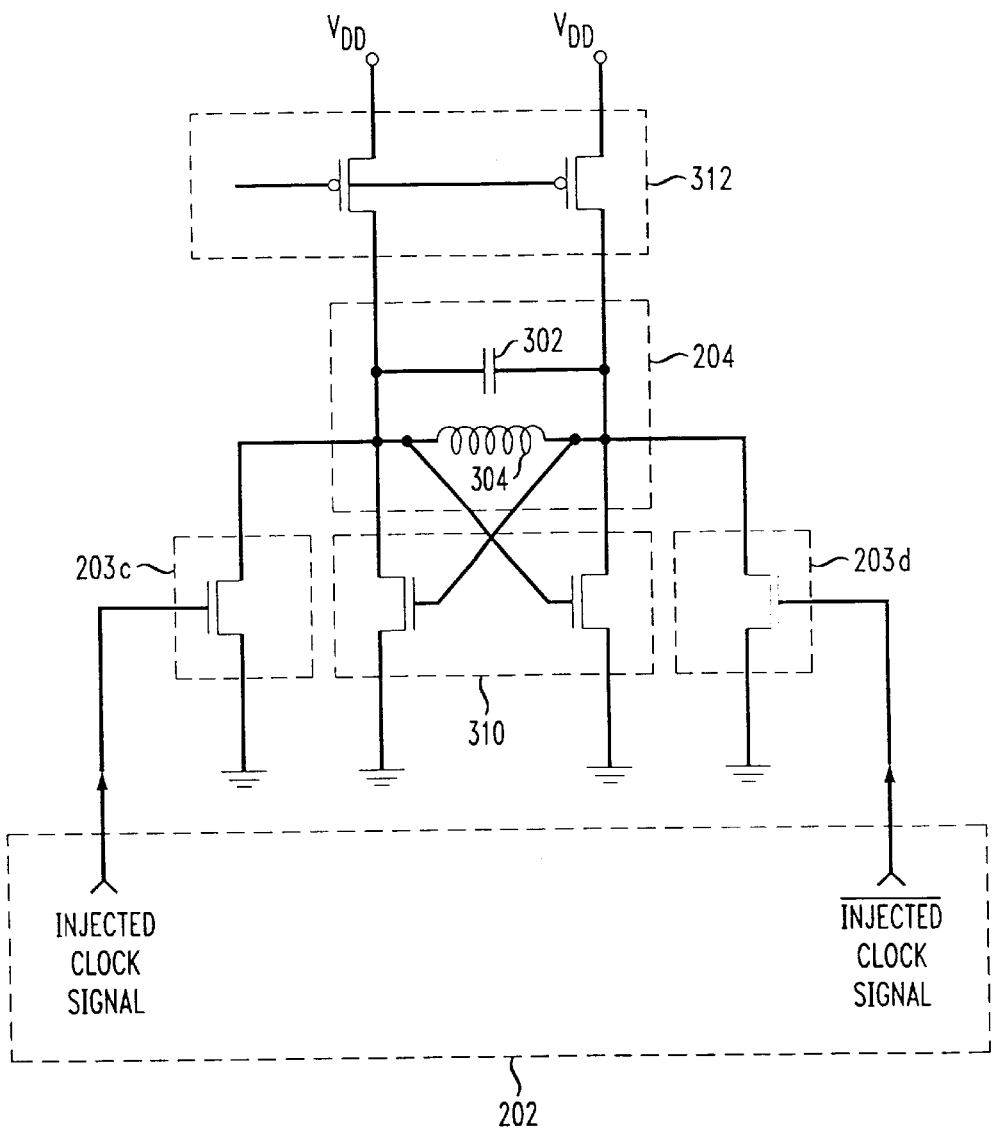
FIG. 6 shows the alternative use of transistors for impedance between the injected AC signal and the LC tank circuit oscillator, in accordance with the principles of the present invention.

The impedance 203 (FIG. 4) is provided by capacitors 203a, 203b in the present embodiment, as shown in FIG. 5. Alternatively, the impedance through which the tuning clock signal is injected could be, e.g., FET transistors 203c, 203d with gates connected to respective phases of the injected clock signal, e.g. an injected clock signal and an inversion or 180° phase-shifted injected clock signal, as shown in FIG. 6.

Figure 7:
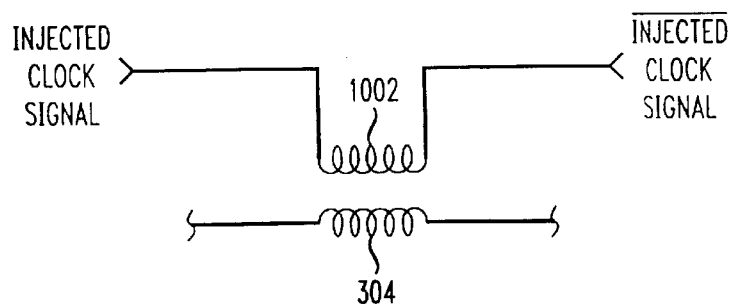
FIG. 7 shows another embodiment of the present invention utilizing inductive coupling to inject a locking frequency signal into the inductor of an LC tank circuit oscillator.

FIG. 7 shows another embodiment of the present invention utilizing inductive coupling to inject a locking frequency signal into the inductor 304 of the LC tank circuit 204.

In particular, FIG. 7 shows that a frequency adjustment of the LC tank circuit oscillator can be achieved by injecting a tuning signal into the LC tank circuit using an inductive element 1002, e.g., a coiled wiring formation forming an inductance. The inductive element 1002 is located sufficiently adjacent the inductor 304 of the LC tank circuit for the inductive element 1002 to cause an induced signal in the LC tank circuit oscillator 204. The impedance between the AC injection signal and the LC tank circuit oscillator would in this embodiment be formed by a metallic core, air and/or an insulative medium.

Figure 8:
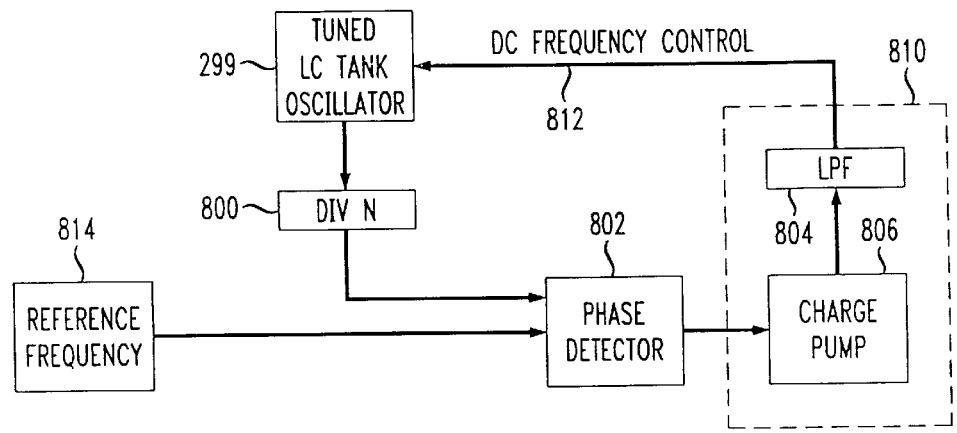
FIG. 8 shows a block diagram of an LC tank circuit oscillator having a nominal frequency tuned by the output of a PLL.

FIG. 8 shows a block diagram of an injected (i.e., tuned) LC tank circuit oscillator 299, e.g., as shown in FIG. 4, but including a varactor or other voltage-controlled adjustable element such that a DC control signal 812 can adjust a nominal frequency of the LC tank circuit oscillator 204. The DC control signal 812 in the embodiment shown in FIG. 8 is provided by a PLL comprising a frequency divider 800, a phase detector 802, and a frequency-to-voltage converter 810.

In particular, the phase detector 802 compares a representation of the tuned frequency of the LC tank circuit oscillator 299, e.g., divided by a frequency divider 800 for convenience, with a reference frequency 814, and outputs a phase differential to a frequency-to-voltage converter 810. The frequency-to-voltage converter 810 includes a charge pump 806 for building up a charge corresponding to the amount of phase differential output by the phase detector 802, and a low pass filter 804 for providing a clean voltage signal corresponding to an amount of change required in the nominal frequency of the tuned LC tank circuit oscillator 299.

Although the tuned LC tank circuit oscillator 299 does not require a PLL for operation, the use of a PLL in conjunction with an injected signal can provide optimum oscillation control and accuracy.

Figure 9:
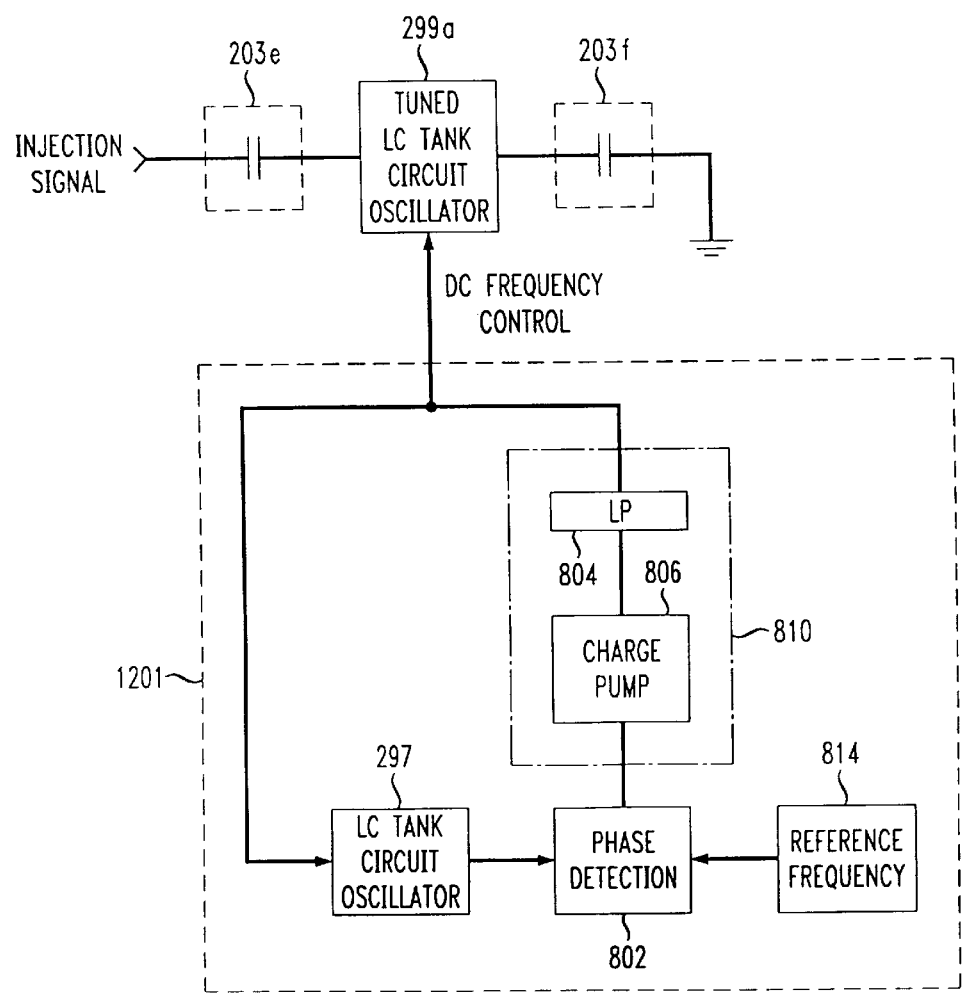
FIG. 9 shows the use of one LC tank circuit oscillator in a closed-loop PLL to control the nominal operating frequency of an open-loop LC tank circuit oscillator.

FIG. 9 shows the use of a DC frequency control signal generated in a closed-loop oscillator system 1201 including a PLL to control a varactor or other voltage-controlled adjustable component in a tuned LC tank circuit oscillator 299a.

In particular, FIG. 9 shows an untuned LC tank circuit oscillator 297 controlled by a PLL including a reference frequency 814, phase detector 802, and frequency-to-voltage converter 810 as described with respect to FIG. 8.

However, because of possible instability caused by injecting an AC tuning signal into a closed-loop oscillating system, it is preferred to inject a tuning AC signal into an open-loop LC tank circuit oscillator 299a as shown in FIG. 9. Thus, only the open-loop LC tank circuit oscillator 299a is tuned with an injection signal. Except for the injection of the AC tuning signal, the LC tank circuit oscillators 297 and 299a may be the same. In FIG. 9, the injection signal is injected singleended into the LC tank circuit oscillator 299a. Of course, the injection signal could also be inverted and applied to the second node of the LC tank circuit oscillator 299a within the principles of the present invention.

Figure 10:
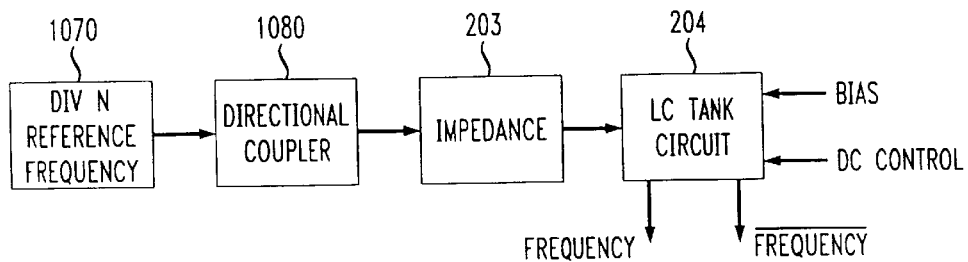
FIG. 10 shows the injection of a divided AC reference signal.

FIG. 10 shows that the AC injection signal may be a reference signal which may be divided in a divider 1070. The divider 1070 may divide the AC injection signal by any value greater than or equal to 1.

FIG. 10 also shows that a directional coupler 1080 may be used to provide reverse-direction isolation between the AC injection signal from the divider 1070 and the LC tank circuit oscillator 204. For instance, a return signal flow from the LC tank circuit oscillator 204 back to the AC injection signal source may be reduced by as much as 10 to 60 decibels (dB) or more in the directional coupler 1080.

Figure 11:
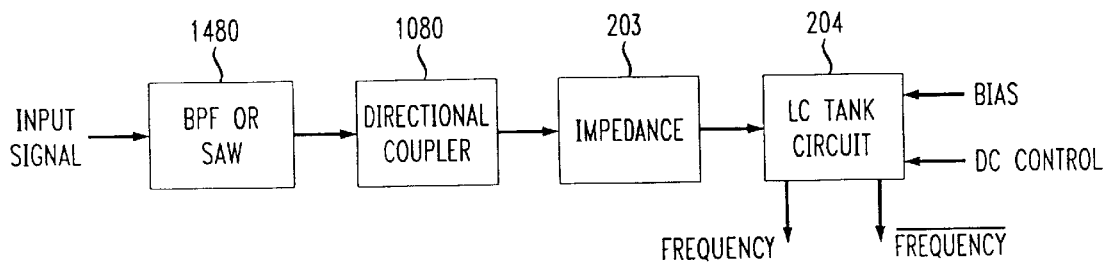
FIG. 11 shows the use of a band pass filter or SAW filter to isolate a desired tuning injection signal.

FIG. 11 shows that the input AC injection signal may be filtered by a band pass filter (BPF) or saw filter 1480 to, e.g., isolate a fundamental or harmonic frequency for injection into the LC tank circuit oscillator 204.

Figure 12:
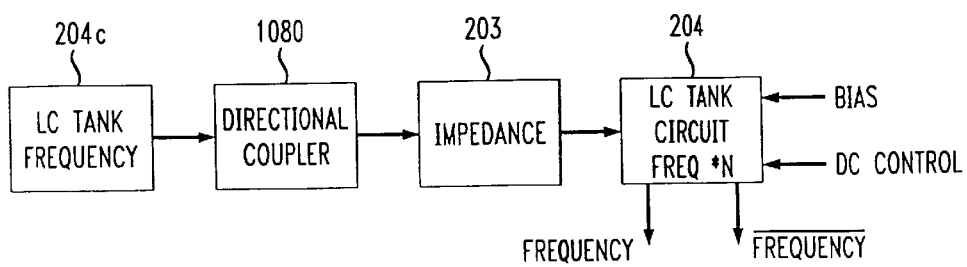
FIG. 12 shows the use of a separate LC tank circuit oscillator to provide an AC injection signal for tuning a higher frequency second LC tank circuit oscillator.

FIG. 12 shows the use of a separate LC tank circuit oscillator 204c to generate the AC injection signal for tuning a higher frequency second LC tank circuit oscillator 204. In this disclosed embodiment, the tuned second LC tank circuit oscillator 204 can provide a multiplication N of the frequency of the first LC tank circuit oscillator 204c, where $N \geq 1$.

Figure 13:
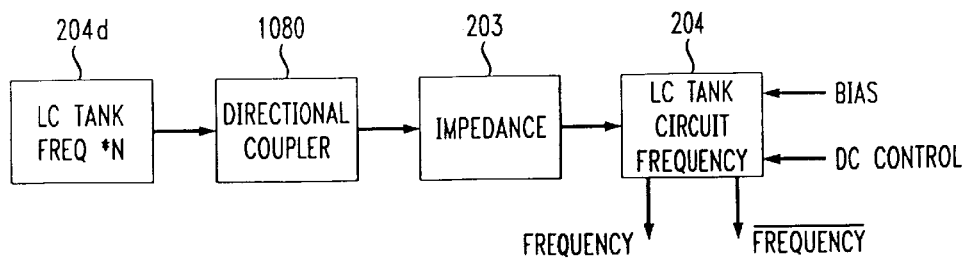
FIG. 13 shows the opposite of FIG. 12, i.e., the provision of a divided frequency from a second, tuned LC tank circuit oscillator with an AC injection signal provided by a separate LC tank circuit oscillator.

FIG. 13 shows the opposite of the embodiment of FIG. 12, i.e., the provision of a divided frequency from a second, tuned LC tank circuit oscillator 204 with an AC injection signal provided by a separate LC tank circuit oscillator 204d running at a multiple N of the desired divided frequency, where $N \geq 1$.

Figure 14:
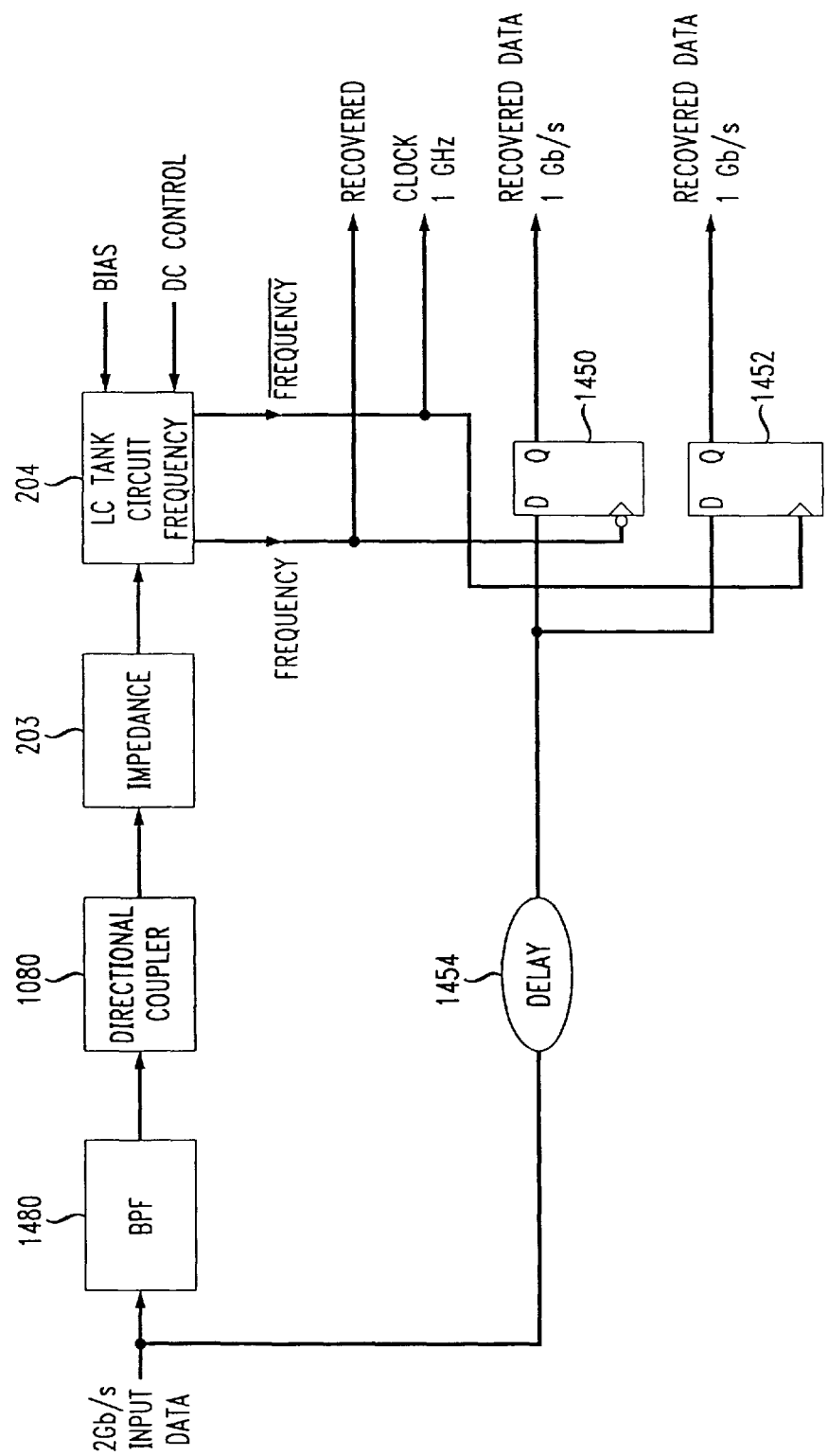
FIG. 14 shows a specific application of the embodiment shown in FIG. 11 used to recover clock and data signals from an input data stream.

FIG. 14 shows a specific application of the embodiment shown in FIG. 11 which can be used to recover clock and data signals from an input data stream.

In particular, a data stream, e.g., a 2 gigabit per second (Gb/s) data stream is input to a band pass filter 1480 for determination of a data clock. The data clock is injected into the LC tank circuit oscillator 204, which outputs stable data clock signals Freq and /Freq. The data clock signals Freq and /Freq are used to latch data in the input data stream using, e.g., Flip-Flops 1450 and/or 1452. A delay 1454 may be necessary in the data recovery path to compensate for the delays in the band pass filter 1480, directional coupler 1080, impedance 203, and/or LC tank circuit oscillator 204.

Figure 15:
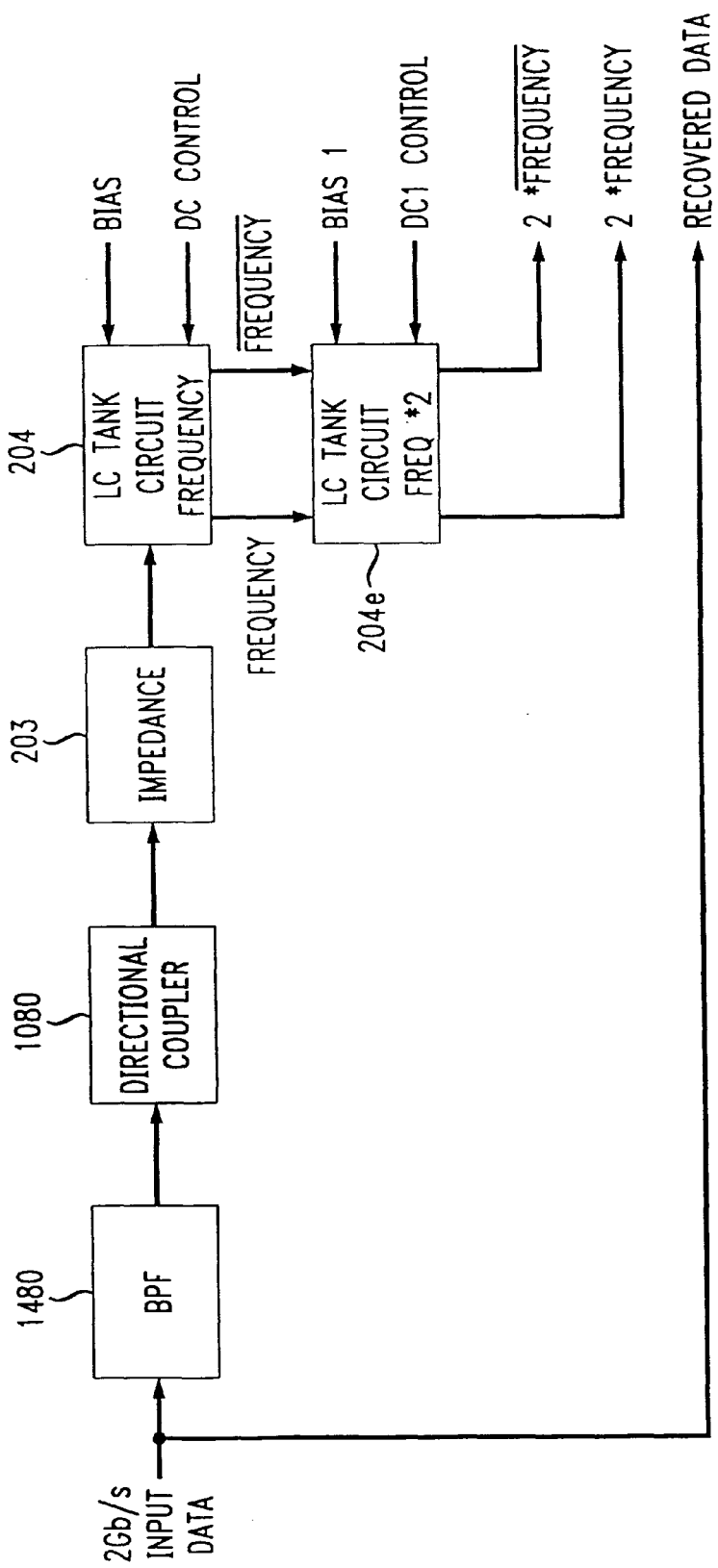
FIG. 15 shows a variation of the embodiment shown in FIG. 14 wherein a second LC tank circuit oscillator is used to provide a stable multiple of the data clock.

FIG. 15 shows a variation of the embodiment shown in FIG. 14 wherein a second LC tank circuit oscillator 204e is used to provide a stable multiple of the data clock, e.g., two times the data clock signals 2*Freq and 2*/Freq. In this embodiment, the first LC tank circuit oscillator 204 is used to injection lock the second LC tank circuit oscillator 204e.

It is possible to introduce more than one reactive or resistive injection signal into the LC tank circuit in accordance with the principles of the present invention.

Figure 16A:
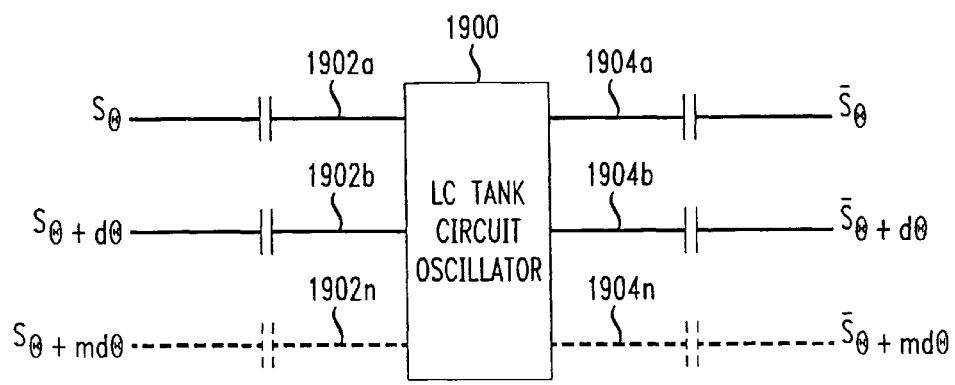
FIG. 16A shows an LC tank circuit oscillator having a plurality of input injection signals at one or more nodes thereof.
Figure 16B:
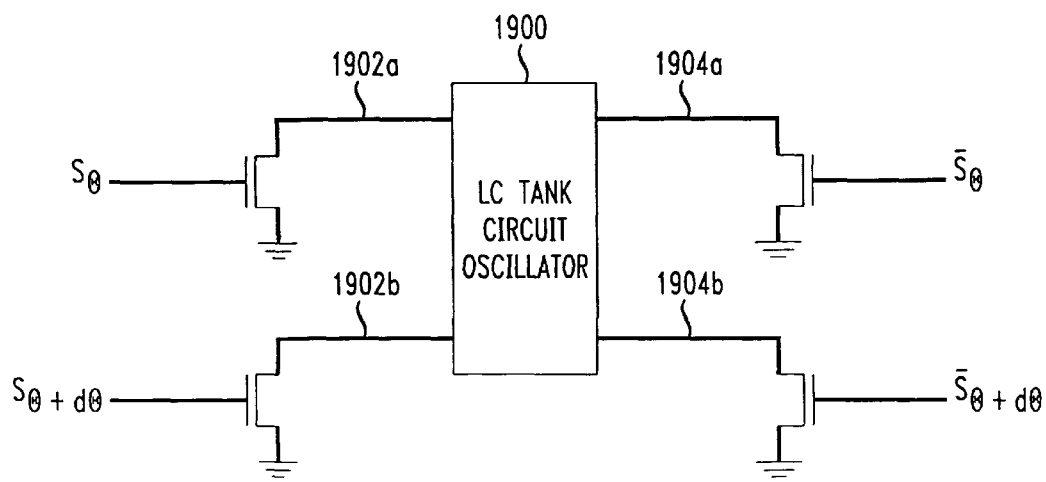
FIG. 16B shows the applicability of other forms of impedance, i.e., FET or bipolar transistors, to the principles of the present invention.

A plurality of injection signals may tune the LC tank circuit as shown in FIGS. 16A and 16B. In particular, FIG. 16A shows an LC tank circuit oscillator 1900 having a plurality of signals 1902a, 1902b, 1902n input to a first node thereof, and a plurality of signals 1904a, 1904b, 1904n input to a second node thereof. Each of the signals 1902a, 1902b and 1902n are out of phase with one another by, e.g., a multiple of an incremental phase differential dθ, as are the complementary signals 1904a, 1904b and 1904n.

The embodiment of FIG. 16A shows capacitive injection locking of the LC tank circuit. However, the invention is equally applicable to the use of transistor devices such as MOSFET or bipolar transistors or inductive devices to inject a frequency locking signal into an LC tank circuit oscillator.

Figure 17:
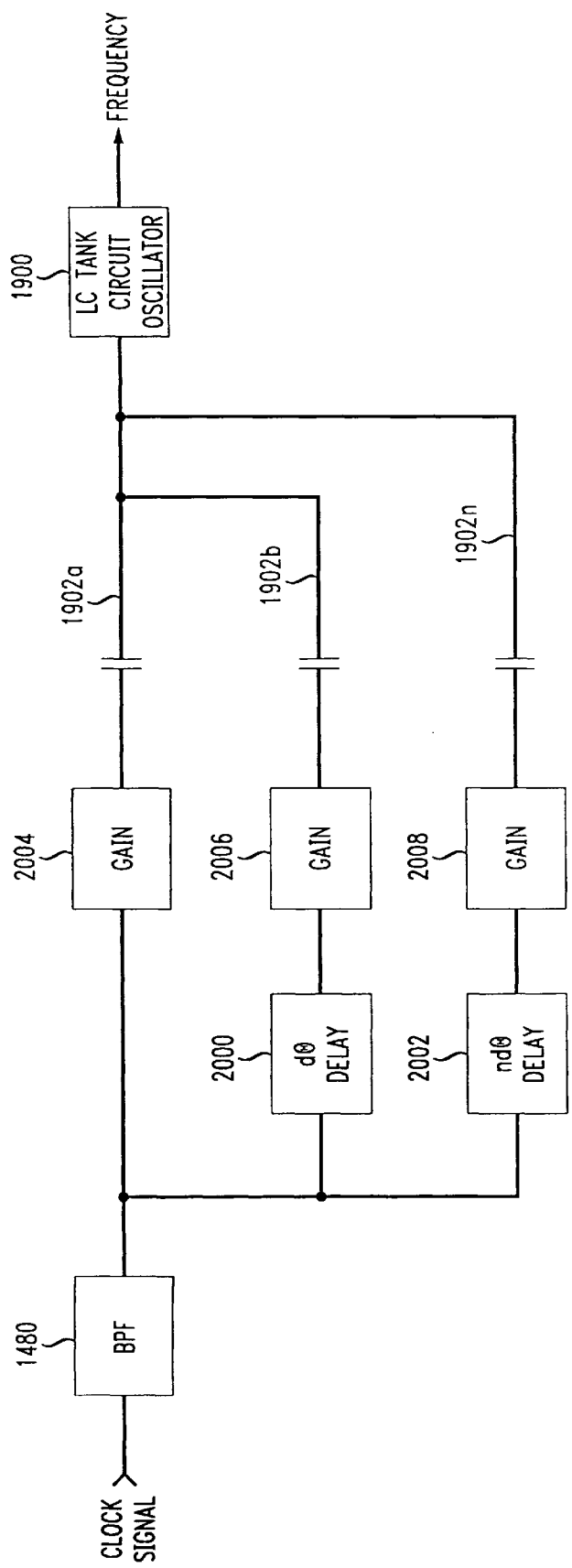
FIG. 17 is a block diagram showing the generation of a plurality of phase shifted injection signals shown in FIGS. 16A and 16B.

FIG. 17 is a block diagram of a circuit for generating the plurality of phase shifted injection signals shown in FIGS. 16A and 16B.

In particular, FIG. 17 illustrates the use of delay elements 2000, 2002 having a time delay selected based on the desired amount of phase shift and the desired injection frequency. As shown in FIG. 17, a recovered clock signal is band pass filtered in a band pass filter 1480 and presented to a plurality of signal paths 1902a, 1902b and 1902n. In the first signal path 1902a, the signal is amplified in a gain stage 2004 and capacitively injected into the LC tank circuit oscillator 1900. In the second signal path 1902b, the signal is delayed to provide a phase shift of dθ, amplified by a gain stage 2006, and capacitively injected into the LC tank circuit 1900. Similarly, in the nth signal path, the signal is phase shifted by an amount of time corresponding to ndθ, amplified in gain stage 2008, and capacitively injected into the LC tank circuit 1900.

The principles of the present invention can be used to phase lock a quadrature oscillator.

Figure 18:
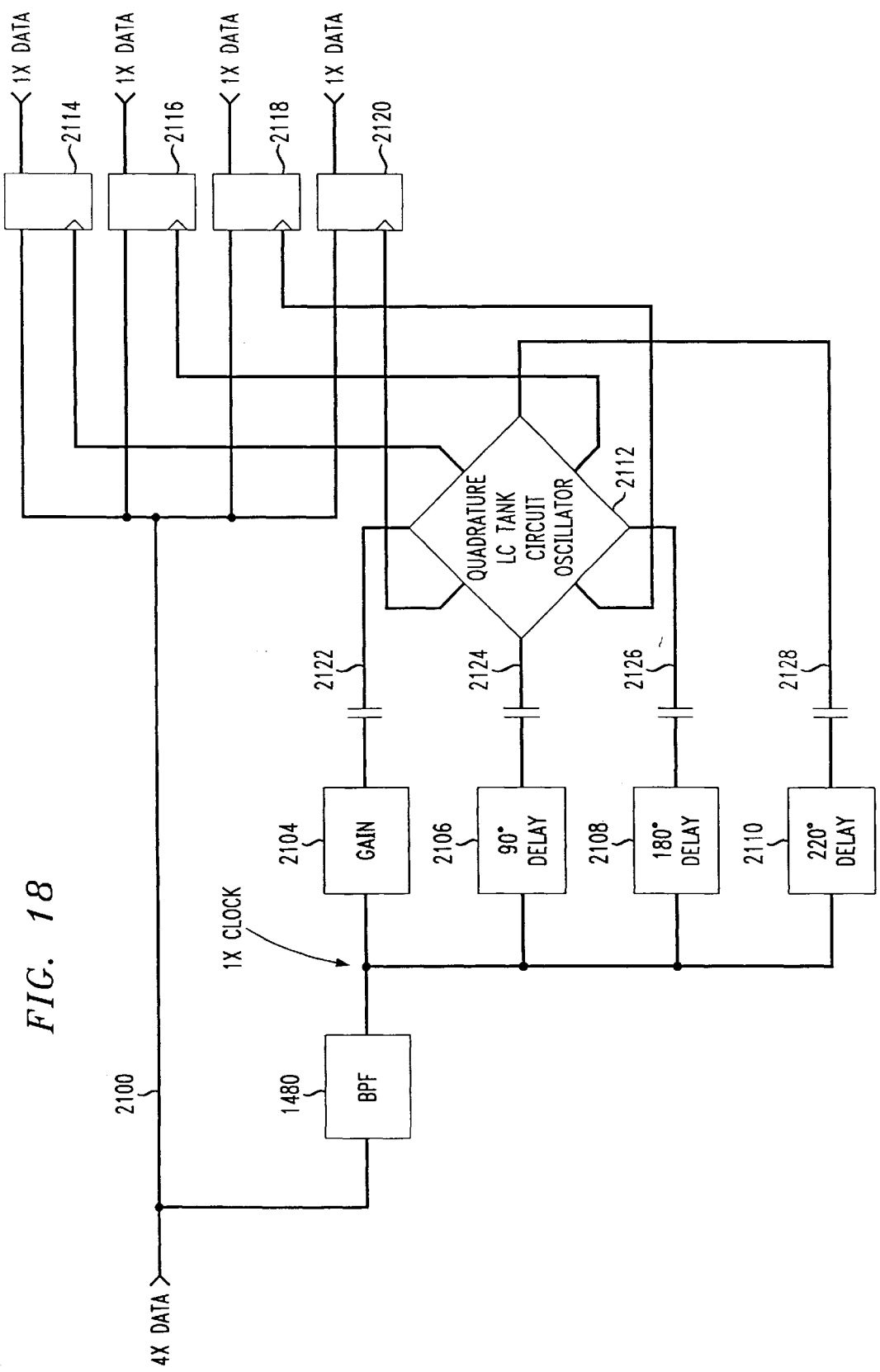
FIG. 18 shows the applicability of the present invention to the injection of tuning signals into oscillators having more than two nodes.

For instance, FIG. 18 shows an input clock signal 2100 at a rate four times the data input to a bandpass filter 1480. The injection locking signal output from the bandpass filter 1480 is presented directly to the quadrature oscillator 2112 through a first signal path 2122. The injection locking signal is also presented to a second node of the quadrature oscillator 2112 through a second signal path 2124 after a 90° phase delay in a phase delay element 2106. Similarly, the injection locking signal is presented to a third node of the quadrature oscillator 2112 through a third signal path 2126 after a 180° phase delay in phase delay element 2108, and is presented to a fourth node of the quadrature oscillator 2112 through a fourth signal path 2128 after a 270° phase delay in phase delay element 2110. The respective 1× data clock signals are output from flip-flop circuits 2114–2120.

Gain stages, e.g., as shown in the embodiments of FIGS. 17 and 18, may not be necessary in the particular application.

Although the embodiment of FIGS. 16A, 16B, 17 and 18 show differential injection locking signals input to the LC tank circuit, a plurality of single-ended injection locking signals may be input to only one node of the LC tank circuit 1900 in accordance with the principles of the present invention.

The inductor and/or capacitor utilized in the LC tank circuit oscillator 204 may be formed in an integrated circuit or may be discrete components, depending upon the particular application.

Accordingly, the operation of the LC tank circuit in accordance with the principles of the present invention can form the basis for a stable clock generator for use by other components.

While the invention has been described with reference to the exemplary embodiments thereof, those skilled in the art will be able to make various modifications to the described embodiments of the invention without departing from the true spirit and scope of the invention.

What is claimed is:

1. A tunable oscillator comprising:
an LC tank circuit comprising an inductor, a capacitor, and a negative resistance in parallel with at least one of said inductor and said capacitor;
an impedance in communication with said LC tank circuit, said impedance being adapted and arranged to allow injection of an AC signal corresponding to a desired oscillation frequency of said LC tank circuit; and
a first flip/flop clocked by a frequency signal output from said LC tank circuit.

2. The tunable oscillator according to claim 1, wherein said LC tank circuit further comprises:
a bias signal to provide power to said LC tank circuit.

3. The tunable oscillator according to claim 1, wherein:
said impedance is connected to a node between said inductor and said capacitor.

4. The tunable oscillator according to claim 1 wherein said impedance comprises:
a capacitor.

5. The tunable oscillator according to claim 1, wherein said impedance comprises:
a transistor.

6. The tunable oscillator according to claim 5, wherein:
said transistor is a bipolar transistor.

7. The tunable oscillator according to claim 5, wherein:
said transistor is a field effect transistor.

8. The tunable oscillator according to claim 1, wherein:
a representation of said AC signal is injected into each of at least two nodes of said tunable oscillator.

9. The tunable oscillator according to claim 8, wherein:
each of said representations of said AC signal is phase shifted from another of said representations of said AC signal.

10. A tunable oscillator, comprising:
an LC tank circuit comprising an inductor and a capacitor;
an impedance in communication with said LC tank circuit, said impedance being adapted and arranged to allow injection of an AC signal corresponding to a desired oscillation frequency of said LC tank circuit; and
an inductive element coupled with said inductor adapted and arranged to inject said AC signal from said inductive element into said inductor;
wherein said impedance is formed by an insulating material.

11. A tunable oscillator, comprising:
an LC tank circuit comprising an inductor and a capacitor;
an impedance in communication with said LC tank circuit, said impedance being adapted and arranged to allow injection of an AC signal corresponding to a desired oscillation frequency of said LC tank circuit; and
a band pass filter to isolate a tuning frequency for injection into said inductor and said capacitor.

12. The tunable oscillator according to claim 1, further comprising:
a phase locked loop adapted to provide a frequency control signal;
at least one component in said LC tank circuit being adjustable under the control of said frequency control signal.

13. A tunable oscillator, comprising:
an LC tank circuit comprising an inductor, a capacitor, and a negative resistance in parallel with at least one of said inductor and said capacitor;
an impedance in communication with said LC tank circuit, said impedance being adapted and arranged to allow injection of an AC signal corresponding to a desired oscillation frequency of said LC tank circuit;
a phase locked loop adapted to provide a frequency control signal; and
at least one component in said LC tank circuit being adjustable under the control of said frequency control signal; wherein
said LC tank circuit is not within a loop of said phase locked loop.

14. A tunable oscillator, comprising:
an LC tank circuit comprising an inductor, a capacitor, and a negative resistance in parallel with at least one of said inductor and said capacitor;
an impedance in communication with said LC tank circuit, said impedance being adapted and arranged to allow injection of an AC signal corresponding to a desired oscillation frequency of said LC tank circuit;
a phase locked loop adapted to provide a frequency control signal; and
at least one component in said LC tank circuit being adjustable under the control of said frequency control signal; wherein
said phase locked loop comprises a second LC tank circuit.

15. A tunable oscillator, comprising:
an LC tank circuit comprising an inductor, a capacitor, and a negative resistance in parallel with at least one of said inductor and said capacitor;
an impedance in communication with said LC tank circuit, said impedance being adapted and arranged to allow injection of an AC signal corresponding to a desired oscillation frequency of said LC tank circuit;
a phase locked loop adapted to provide a frequency control signal; and
at least one component in said LC tank circuit being adjustable under the control of said frequency control signal; wherein
a directional coupler between said AC signal and said LC tank circuit to limit a signal flow back from said LC tank circuit.

16. A tunable oscillator comprising:
an LC tank circuit comprising an inductor and a capacitor;
a plurality of impedances in communication with said LC tank circuit, each of said plurality of impedances being adapted and arranged to allow injection of a respective phase of an AC signal corresponding to a desired oscillation frequency of said LC tank circuit, wherein said AC signal has a plurality of phases greater than two.

17. The tunable oscillator according to claim 16, wherein:
said plurality is greater than two.

18. The tunable oscillator according to claim 16, wherein:
each of said plurality of impedances is a transistor.

19. The tunable oscillator according to claim 17, wherein:
each of said plurality of impedances is a capacitor.

20. A tunable quadrature oscillator comprising:
a quadrature LC tank circuit comprising an inductance and a capacitance, said quadrature LC tank circuit having at least four nodes;

at least four impedances corresponding to said at least four nodes of said quadrature LC tank circuit, each of said plurality of impedances being adapted and arranged to allow injection of a respective phase of an AC signal corresponding to a desired oscillation frequency of said LC tank circuit.

21. The tunable quadrature oscillator according to claim 20, wherein:
each respective phase of said AC signal is separated by 90° from another phase of said AC signal.

22. A method of tuning an oscillator, comprising:
injecting an AC signal corresponding to a desired oscillation frequency into an oscillator circuit;
injecting a phase-shifted representation of said AC signal into said oscillator circuit, wherein said phase-shifted representation of said AC signal is shifted 90° with respect to said AC signal, and said AC signal, and said phase-shifted representation of said AC signal are each presented to a common node of said oscillator circuit; and
whereby said oscillator circuit is tuned to said desired oscillation frequency.

23. The method of tuning an oscillator according to claim 22, wherein:
said oscillator circuit is an LC tank circuit oscillator.

24. The method of tuning an oscillator according to claim 22, wherein:
said phase-shifted representation of said AC signal is shifted 180° with respect to said AC signal.

25. The method of tuning an oscillator according to claim 24, wherein:
said oscillator circuit is an LC tank circuit oscillator.

26. The method of tuning an oscillator according to claim 22, wherein:
said oscillator circuit is an LC tank circuit oscillator.

27. Apparatus for tuning an oscillator, comprising:
means for injecting an AC signal corresponding to a desired oscillation frequency into an oscillator circuit, wherein said oscillator circuit is an LC tank circuit oscillator;
whereby said oscillator circuit is tuned to said desired oscillation frequency; and
a first flip/flop clocked by a frequency signal output from said LC tank circuit.

28. The apparatus for tuning an oscillator according to claim 27, wherein:
said first flip/flop receives a signal containing digital data information, and outputs a recovered data signal.

29. The apparatus for tuning an oscillator according to claim 27, wherein:
said output recovered data signal contains approximately half of said digital data information contained in said received signal.

30. The apparatus for tuning an oscillator according to claim 27, further comprising:
a second flip/flop clocked by an inverse of said frequency signal;
said first flip/flop receiving a signal containing digital data information, and outputting a first recovered data signal containing a first portion of said digital data information contained in said received signal; and
said second flip/flop receiving said signal containing digital data information, and outputting a second recovered data signal containing a second portion of said digital data information contained in said received signal.

31. The apparatus for tuning oscillator according to claim 30, wherein:
said first portion of said digital data information is one half of said digital data information; and
said second portion of said digital data information is a second half of said digital data information.

32. The apparatus for tuning oscillator according to claim 31, wherein:
said first half and said second half are interleaved.

33. A data communication device, comprising:
a data receiver; and
a tuned oscillator, said tuned oscillator comprising:
an LC tank circuit comprising an inductor, a capacitor, a negative resistance in parallel with at least one of said inductor and said capacitor, and a first flip/flop clocked by a frequency signal output from said LC tank circuit, and
an impedance in communication with said LC tank circuit, said impedance being adapted and arranged to allow injection of an AC signal corresponding to a desired oscillation frequency of said LC tank circuit.

34. The data communication device according to claim 33, wherein:
said data receiver is a modem.

35. A tunable oscillator comprising:
an LC tank circuit comprising an inductor and a capacitor;
an impedance in communication with said LC tank circuit, said impedance being adapted and arranged to allow injection of an AC signal corresponding to a desired oscillation frequency of said LC tank circuit;
a phase locked loop adapted to provide a frequency control signal; and
at least one component in said LC tank circuit being adjustable under the control of said frequency control signal, wherein said LC tank circuit is not within a loop of said phase locked loop.

36. A tunable oscillator comprising:
an LC tank circuit comprising an inductor and a capacitor;
an impedance in communication with said LC tank circuit, said impedance being adapted and arranged to allow injection of an AC signal corresponding to a desired oscillation frequency of said LC tank circuit;
a phase locked loop adapted to provide a frequency control signal; and
at least one component in said LC tank circuit being adjustable under the control of said frequency control signal, wherein said phase locked loop comprises a second LC tank circuit.

37. A tunable oscillator comprising:
an LC tank circuit comprising an inductor and a capacitor;
an impedance in communication with said LC tank circuit, said impedance being adapted and arranged to allow injection of an AC signal corresponding to a desired oscillation frequency of said LC tank circuit;
a phase locked loop adapted to provide a frequency control signal;
at least one component in said LC tank circuit being adjustable under the control of said frequency control signal; and
a directional coupler between said AC signal and said LC tank circuit to limit a signal flow back from said LC tank circuit.

38. A data communication device, comprising:

a data receiver; and a tuned oscillator, said tuned oscillator comprising:

- an LC tank circuit comprising an inductor, and a capacitor;
- an impedance in communication with said LC tank circuit, said impedance being adapted and arranged to allow injection of an AC signal corresponding to a desired oscillation frequency of said LC tank circuit;
- a phase locked loop adapted to provide a frequency control signal; and
- at least one component in said LC tank circuit being adjustable under the control of said frequency control signal, wherein said LC tank circuit is not within a loop of said phase locked loop.

39. A data communication device, comprising:

a data receiver; and a tuned oscillator, said tuned oscillator comprising:

- an LC tank circuit comprising an inductor, and a capacitor;
- an impedance in communication with said LC tank circuit, said impedance being adapted and arranged to allow injection of an AC signal corresponding to a desired oscillation frequency of said LC tank circuit;
- a phase locked loop adapted to provide a frequency control signal; and
- at least one component in said LC tank circuit being adjustable under the control of said frequency control signal, wherein said phase locked loop comprises a second LC tank circuit.

40. A data communication device, comprising:

a data receiver; and a tuned oscillator, said tuned oscillator comprising:

- an LC tank circuit comprising an inductor, and a capacitor;
- an impedance in communication with said LC tank circuit, said impedance being adapted and arranged to allow injection of an AC signal corresponding to a desired oscillation frequency of said LC tank circuit;
- a phase locked loop adapted to provide a frequency control signal;
- at least one component in said LC tank circuit being adjustable under the control of said frequency control signal; and
- a directional coupler between said AC signal and said LC tank circuit to limit a signal flow back from said LC tank circuit.

41. The tunable oscillator according to claim 1, wherein:

said first flip/flop receives a signal containing digital data information, and outputs a recovered data signal.

42. The tunable oscillator according to claim 41, wherein:

said output recovered data signal contains approximately half of said digital data information contained in said received signal.

43. The tunable oscillator according to claim 1, further comprising:

a second flip/flop clocked by an inverse of said frequency signal;

said first flip/flop receiving a signal containing digital data information, and outputting a first recovered data signal containing a first portion of said digital data information contained in said received signal; and said second flip/flop receiving said signal containing digital data information, and outputting a second recovered data signal containing a second portion of said digital data information contained in said received signal.

44. The tunable oscillator according to claim 43, wherein:

said first portion of said digital data information is one half of said digital data information; and said second portion of said digital data information is a second half of said digital data information.

45. The tunable oscillator according to claim 44, wherein:

said first half and said second half are interleaved.

* * * * *